US009054496B2

(12) United States Patent
Song

(10) Patent No.: US 9,054,496 B2
(45) Date of Patent: Jun. 9, 2015

(54) VERTICAL-CAVITY SURFACE-EMITTING LASER AND METHOD OF FABRICATING THE SAME

(71) Applicant: Electronics and Telecommunications Research Institute, Daejeon (KR)

(72) Inventor: Hyun Woo Song, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 13/974,891

(22) Filed: Aug. 23, 2013

(65) Prior Publication Data

US 2014/0079085 A1  Mar. 20, 2014

(30) Foreign Application Priority Data

Sep. 18, 2012  (KR) ........................ 10-2012-0103345

(51) Int. Cl.
*H01S 5/00* (2006.01)
*H01S 5/183* (2006.01)
*H01S 5/20* (2006.01)
*H01S 5/06* (2006.01)

(52) U.S. Cl.
CPC ........... *H01S 5/18361* (2013.01); *H01S 5/2081* (2013.01); *H01S 5/0614* (2013.01); *H01S 5/18311* (2013.01); *H01S 5/18341* (2013.01); *H01S 5/18366* (2013.01); *H01S 5/18386* (2013.01); *H01S 5/18391* (2013.01)

(58) Field of Classification Search
USPC ........................... 372/45.01, 20, 44.01, 43.01
See application file for complete search history.

(56) References Cited

U.S. PATENT DOCUMENTS

| 6,645,784 | B2 * | 11/2003 | Tayebati et al. ................. 438/46 |
| 6,829,399 | B2 | 12/2004 | Bozler et al. |
| 7,482,192 | B2 | 1/2009 | Yu et al. |
| 2005/0178740 | A1 * | 8/2005 | Wang ............................... 216/67 |
| 2006/0063324 | A1 * | 3/2006 | Park et al. ..................... 438/239 |
| 2007/0153860 | A1 * | 7/2007 | Chang-Hasnain et al. ......................... 372/50.124 |
| 2010/0304517 | A1 * | 12/2010 | Jeong et al. ..................... 438/50 |

OTHER PUBLICATIONS

M.Y. Li et al., "High performance continuously tunable top-emitting vertical cavity laser with 20nm wavelength range", Electronics Letters, Jun. 5, 1997, pp. 1051-1052, vol. 33, No. 12.
Chin-I. Liao et al., "Highly Selective Etching of GaAs on $Al_{0.2}Ga0.8$ As Using Citric Acid/$H_2O_2$/$H_2O$ Etching System", Electrochemical and Solid-State Letters, 2004, pp. C129-C132, vol. 7, No. 11.
S. Salimian et al., "Selective dry etching of GaAs over AlGaAs in $SF_6$/$SiCl_4$ mixtures", American Vaccum Society, 1988, pp. 1641-1644, vol. 6, No. 6.

* cited by examiner

*Primary Examiner* — Colleen A Matthews
*Assistant Examiner* — Vu A Vu

(57) ABSTRACT

Provided are a wavelength swept vertical-cavity surface-emitting laser and a method of fabricating the same. The laser may include a substrate, a lower reflection layer on the substrate, an active layer on the lower reflection layer, a sacrificial layer disposed on a first side of the active layer, a stopper disposed on a second side of the active layer that may be spaced apart from the sacrificial layer, and an upper reflection layer fixed on the sacrificial layer, the upper reflection layer extending over the stopper and the active layer. The stopper defines a minimum separation distance between the upper reflection layer and the active layer.

20 Claims, 13 Drawing Sheets

VERTICAL-CAVITY SURFACE-EMITTING LASER AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2012-0103345, filed on Sep. 18, 2012, in the Korean Intellectual Property Office, the entire contents of which are hereby incorporated by reference.

BACKGROUND OF THE INVENTION

Example embodiments of the inventive concept relate to a broadband wavelength swept light source, and in particular, to a vertical-cavity surface-emitting laser with a tunable cavity.

In general, an optical coherence tomography technology is achieved using a broadband wavelength swept light source, because the use of the broadband wavelength swept light source makes it possible to realize a high-resolution high-speed imaging.

A wavelength swept vertical-cavity surface-emitting laser, one of the broadband wavelength swept light sources, includes a mirror constituting a MEMS-based cavity. To achieve a stabilized operation property and a long lifetime, it is necessary to improve mechanical reliability of the mirror in the vertical-cavity surface-emitting laser. However, the conventional wavelength swept vertical-cavity surface-emitting laser suffers from low mechanical reliability of the mirror.

SUMMARY

Example embodiments of the inventive concept provide a wavelength swept vertical-cavity surface-emitting laser, which is configured to prevent a current spreading layer from being stuck on an upper reflection layer and to prevent a pull-in effect from occurring, and a method of fabricating the same.

Other example embodiments of the inventive concept provide a wavelength swept vertical-cavity surface-emitting laser with a long lifetime and a high speed operation property and a method of fabricating the same.

According to example embodiments of the inventive concepts, a vertical-cavity surface-emitting laser may include a substrate, a lower reflection layer on the substrate, an active layer on the lower reflection layer, a sacrificial layer disposed on a first side of the active layer, a stopper disposed on a second side of the active layer that may be spaced apart from the sacrificial layer, and an upper reflection layer fixed on the sacrificial layer and extending over the stopper and the active layer.

The stopper defines a minimum separation distance between the upper reflection layer and the active layer.

In example embodiments, the upper reflection layer may include a fixation part on the sacrificial layer, a spring connected to the fixation part, the spring extending from the first side to the second side, and a membrane provided on the active layer. The membrane may be connected to the spring and may be separated from the stopper.

In example embodiments, the membrane may be provided to have a hole exposing the stopper.

In example embodiments, the stopper has a diameter greater than that of the hole.

In example embodiments, the stopper may include a bottom block provided below the hole, and a capping layer covering the bottom block and on the active layer.

In example embodiments, the bottom block has substantially the same shape as that of the hole.

In example embodiments, the bottom block may include a silicon oxide layer or a silicon nitride layer.

In example embodiments, the capping layer may include a metal oxide layer.

In example embodiments, the laser may further include a current spreading layer disposed below the bottom block and the sacrificial layer to cover the active layer.

In example embodiments, the laser may further include a first electrode disposed on an edge of the lower reflection layer or substrate, a second electrode disposed on an edge of the current spreading layer, and a third electrode disposed on the fixation part of the upper reflection layer.

In example embodiments, the first electrode may be provided below the lower reflection layer or on the substrate.

In example embodiments, the capping layer may be provided to cover the first electrode, the second electrode, and the third electrode.

In example embodiments, the laser may further include an ohmic contact layer between the second electrode and the current spreading layer.

In example embodiments, the laser may further include a current confining layer between the lower reflection layer and the active layer.

In example embodiments, a top surface of the sacrificial layer may be higher than that of the stopper.

In example embodiments, the sacrificial layer may include a metal oxide layer.

In example embodiments, the spring may further include at least one of a metal layer or a metal oxide layer.

According to other example embodiments of the inventive concepts, a method of fabricating a vertical-cavity surface-emitting laser may include stacking a lower reflection layer, an active layer, a current spreading layer, a sacrificial layer, and an upper reflection layer on a substrate, removing edge portions of the upper reflection layer, the sacrificial layer, the current spreading layer, and the active layer to expose a portion of the lower reflection layer, patterning the upper reflection layer to form a fixation part, a spring, and a membrane, removing an edge portion of the sacrificial layer to expose a portion of the current spreading layer, forming a first electrode, a second electrode, and a third electrode on the lower reflection layer or the substrate, the current spreading layer, and the fixation part, respectively, forming a hole through the membrane, removing a portion of the sacrificial layer located below the hole, forming a bottom block on the current spreading layer exposed by the hole, removing other portions of the sacrificial layer located between the spring and the current spreading layer and between the membrane and the current spreading layer, and forming a capping layer on the bottom block.

In example embodiments, the bottom block may be formed by a thermal evaporation process or an e-beam deposition process.

In example embodiments, the sacrificial layer may be removed using an etching process configured to suppress the upper reflection layer from being etched.

In example embodiments, the removing of the sacrificial layer may be performed using a dry etching process, in which mixture gas of sulphur hexaflouride and silicon tetrachloride may be used as a reaction gas.

In example embodiments, the removing of the sacrificial layer may be performed using a wet etching process, in which mixture of ammonium hydroxide, hydrogen peroxide, and deionized water may be used as etching solution.

In example embodiments, the capping layer may be formed by a chemical vapor deposition or an atomic layer deposition.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
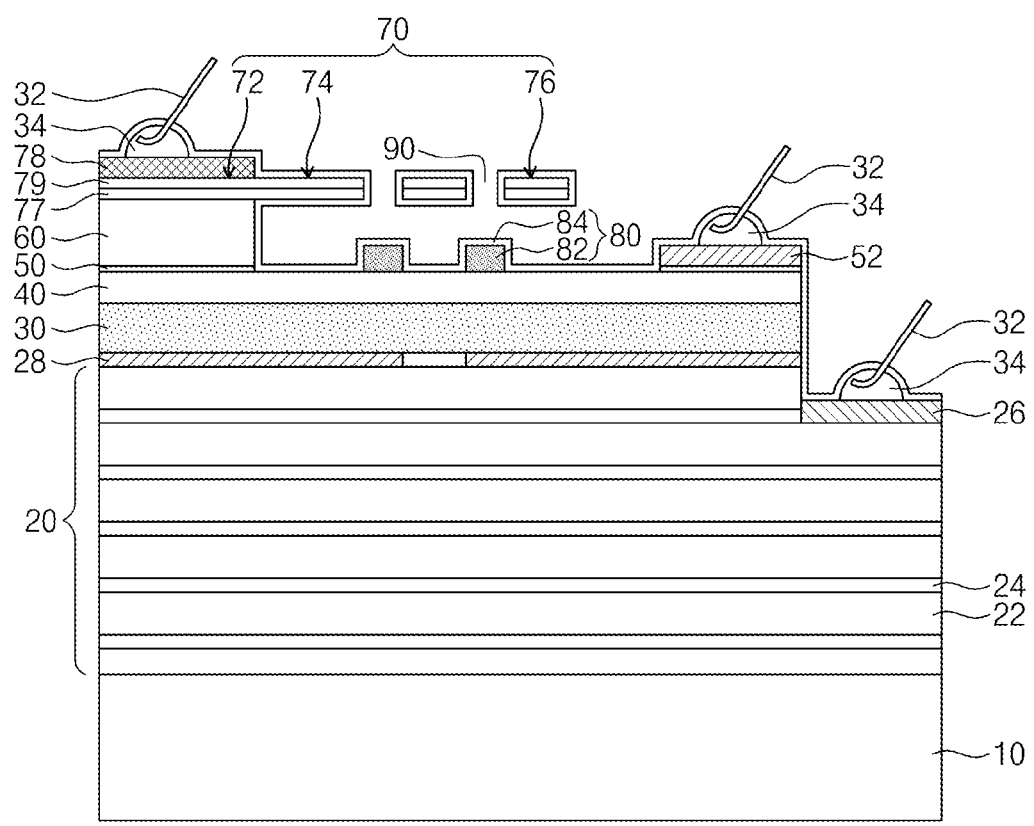
FIG. 1 is a cross-sectional view illustrating a vertical-cavity surface-emitting laser according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
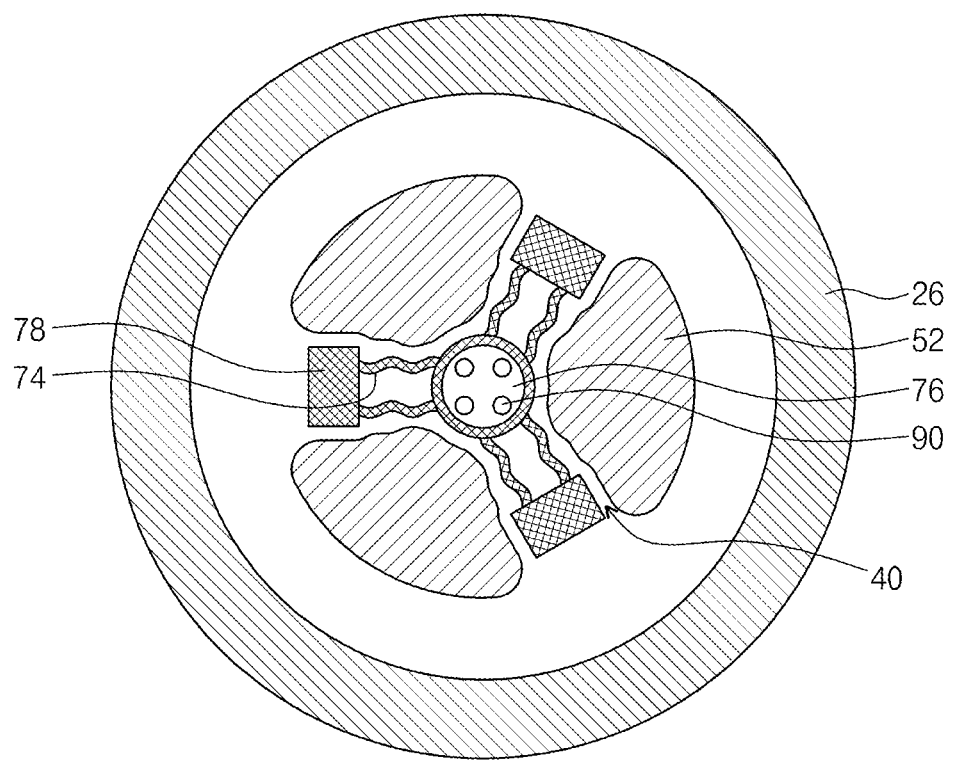
FIG. 2 is a top view of FIG. 1.

FIG. 1 is a cross-sectional view illustrating a vertical-cavity surface-emitting laser according to example embodiments of the inventive concept. FIG. 2 is a top view of FIG. 1.

Referring to FIGS. 1 and 2, a wavelength swept vertical-cavity surface-emitting laser according to example embodiments of the inventive concept may include a substrate 10, a lower reflection layer 20, a first electrode 26, a current confining layer 28, an active layer 30, a current spreading layer 40, an ohmic contact layer 50, a second electrode 52, a sacrificial layer 60, an upper reflection layer 70, a third electrode 78, and a stopper 80.

The substrate 10 may include indium phosphide (InP), gallium arsenide (GaAs) or gallium nitride (GaN).

The lower reflection layer 20 may include a first reflection layer 22 and a second reflection layer 24. The lower reflection layer 20 may be provided to have a first conductivity type. In example embodiments, the first conductivity type may be an n-type.

The lower reflection layer 20 may be lattice-matched to the substrate 10. The first reflection layer 22 and the second reflection layer 24 may be stacked alternatingly and repeatedly. In the case where the substrate 10 is formed of gallium arsenide (GaAs), the first reflection layer 22 may include AlGaAs or GaAs. The second reflection layer 24 may include (Al)GaAs or AlAs. The lower reflection layer 20 may include AlGaAs/GaAs, AlGaAs/AlAs, or AlGaAs/AlGaAs. In the case where the substrate 10 is formed of indium phosphide (InP), the first reflection layer 22 may include InAlAs or InGaAsP. The second reflection layer 24 may include InAlGaAs, GaAsInP, or InP. The lower reflection layer 20 may include InAlAs/InAlGaAs, InGaAsP/InP, or InGaAsP/GaAsInP. In example embodiments, the lower reflection layer 20 may be configured to have reflectivity of about 99.9%. The first electrode 26 may be provided on an edge portion of the lower reflection layer 20. The first electrode 26 may be grounded. The first electrode 26 may be provided around the second electrode 52. In example embodiments, the first electrode 26 may be provided at the substrate 10.

The active layer 30 may have a quantum well structure. The active layer 30 may include a semiconductor multi-layered structure that is lattice-matched to the substrate 10 and the lower reflection layer 20. For example, the active layer 30 may have a multi-layered structure of GaAs/AlGaAs, InGaAs/GaAs, InGaAs/AlGaAs, AlGaAs/AlGaAs, InGaAs/InAlAs, InGaAs/InAlGaAs, InAlGaAs/InAlAs, InGaAsP/InP, InAlGaAs/InAlGaAs, or InGaAsP/InGaAsP. In example embodiments, the active layer 30 may be an intrinsic layer.

The current spreading layer 40 may be lattice-matched to the substrate 10 or the active layer 30. The current spreading layer 40 may have a second conductivity type. The second conductivity type may be a p-type. The ohmic contact layer 50 and the stopper 80 may be provided on the current spreading layer 40.

The ohmic contact layer 50 may be disposed between the second electrode 52 and the current spreading layer 40. The second electrode 52 and the ohmic contact layer 50 may be configured to deliver an operation current to the current spreading layer 40 from an external source. The operation current may be an electric current that is used to generate laser light from the active layer 30. The second electrode 52 may be disposed between the first electrode 26 and the upper reflection layer 70. The stopper 80 may be configured to prevent the upper reflection layer 70 from being stuck to the current spreading layer 40. The stopper 80 and the upper reflection layer 70 will be described in more detail below.

The sacrificial layer 60 may be provided on the ohmic contact layer 50. The sacrificial layer 60 may be disposed spaced apart from the stopper 80 and the second electrode 52. The sacrificial layer 60 may be configured to fix the upper reflection layer 70. The sacrificial layer 60 may have a top surface that is higher than the stopper 80. The sacrificial layer 60 may separate the upper reflection layer 70 electrically from the ohmic contact layer 50.

The upper reflection layer 70 may extend toward a first direction, on the sacrificial layer 60. The upper reflection layer 70 may include a fixation part 72, a spring 74, and a membrane 76. The fixation part 72 may be provided on the sacrificial layer 60. The third electrode 78 may be provided on the fixation part 72. At least one solder ball 34 and at least one wire 32 may be provided on the first electrode 26, the second electrode 52, and the third electrode 78. The third electrode 78 may be applied with an operation voltage. In example embodiments, the operation voltage may be used to control a distance between the membrane 76 and the active layer 30. The spring 74 and the membrane 76 may be spaced apart from the ohmic contact layer 50. The spring 74 may connect the fixation part 72 to the membrane 76. The spring 74 may be configured to have elasticity or restoring force.

The membrane 76 may move vertically on the substrate 10, when an electrostatic force is applied thereto. The electrostatic force may be induced by a potential difference between the membrane 76 and the current spreading layer 40. The membrane 76 and the lower reflection layer 20 may be configured to induce optical resonance. The laser light may be generated from the active layer 30 between the membrane 76 and the lower reflection layer 20. The membrane 76 may have reflectivity of about 99.5%. The membrane 76 may emit the laser light.

The membrane 76 may be formed to have at least one hole 90. The hole 90 may be aligned with the stopper 80. The hole 90 and the stopper 80 may have the same shape. The hole 90 may have a diameter smaller than that of the stopper 80. The membrane 76 may include at least one third reflection layer 77 and at least one fourth reflection layer 79 that are stacked repeatedly. In example embodiments, the third reflection layer 77 and the fourth reflection layer 79 may be formed of the same materials as the first reflection layer 22 and the second reflection layer 24, respectively.

The fixation part 72 and the spring 74 may have a stacking structure different from the membrane 76. To control a spring constant of the spring 74, a metal layer may be further provided on the spring 74 and a thickness of a capping layer 84 may be adjusted.

The stopper 80 may separate the membrane 76 from the current spreading layer 40. For example, a minimum separation distance between the membrane 76 and the current spreading layer 40 may be defined by the stopper 80. The stopper 80 may include a bottom block 82 and the capping layer 84. The bottom block 82 may include a silicon oxide layer or a silicon nitride layer. The bottom block 82 may be provided on the current spreading layer 40. The capping layer 84 may be provided to cover the upper reflection layer 70, the bottom block 82, and the current spreading layer 40. The capping layer 84 may include metal oxide (e.g., aluminum oxide, titanium oxide, zinc oxide, tungsten oxide, or tantalum oxide).

Figure 3:
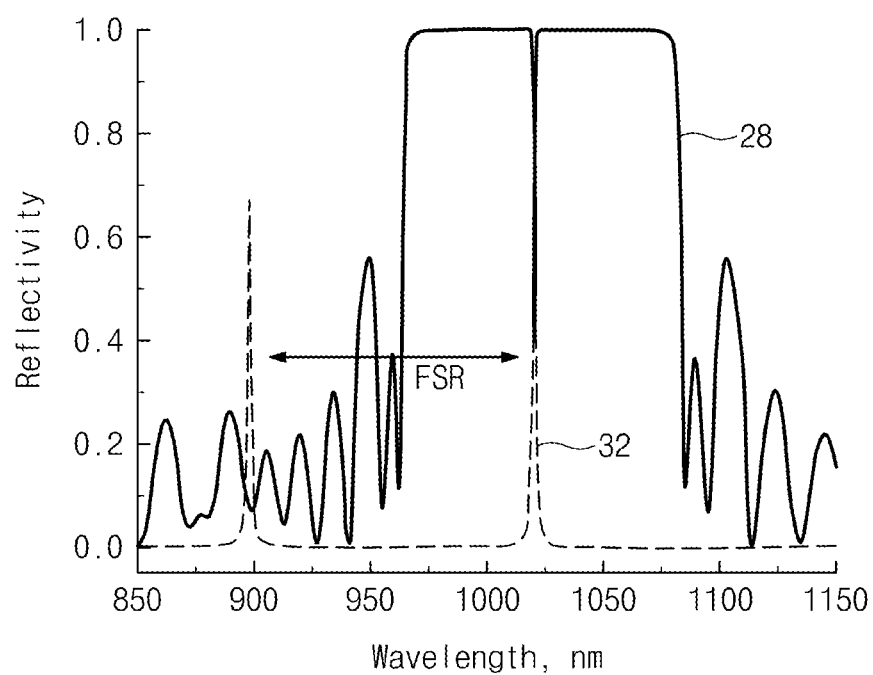
FIG. 3 is a graph showing a relationship between reflectivity and wavelength.

FIG. 3 is a graph showing a relationship between reflectivity and wavelength.

Referring to FIGS. 1 and 3, the membrane 76 may induce a resonance of single longitudinal mode laser within a high reflectivity spectrum range of the lower reflection layer 20. In FIG. 3, a curve "28" shows reflectivity spectra of a laser cavity between the lower reflection layer 20 and the upper reflection membrane 76, and a curve "32" shows resonance mode spectra of a laser light between the lower reflection layer 20 and the upper reflection membrane 76 The lower reflection layer 20 had high reflectivity at a wavelength range having a width of about 100 nm. For example, the laser exhibited high reflectivity at a wavelength range of about 975 nm to 1075 nm.

The membrane 76 may be provided in such a way that an optical path length between it and the lower reflection layer 20 is about three times of a center wavelength of the laser. In other words, an effective cavity length between the membrane 76 and the lower reflection layer 20 may be three times of the wavelength of the laser. In this case, a free spectral range (FSR) had a width of about 120 nm. The single longitudinal mode laser may be generated in the high reflectivity spectrum range. Accordingly, the vertical-cavity surface-emitting laser may be used for a broadband wavelength swept light source.

Figure 4:
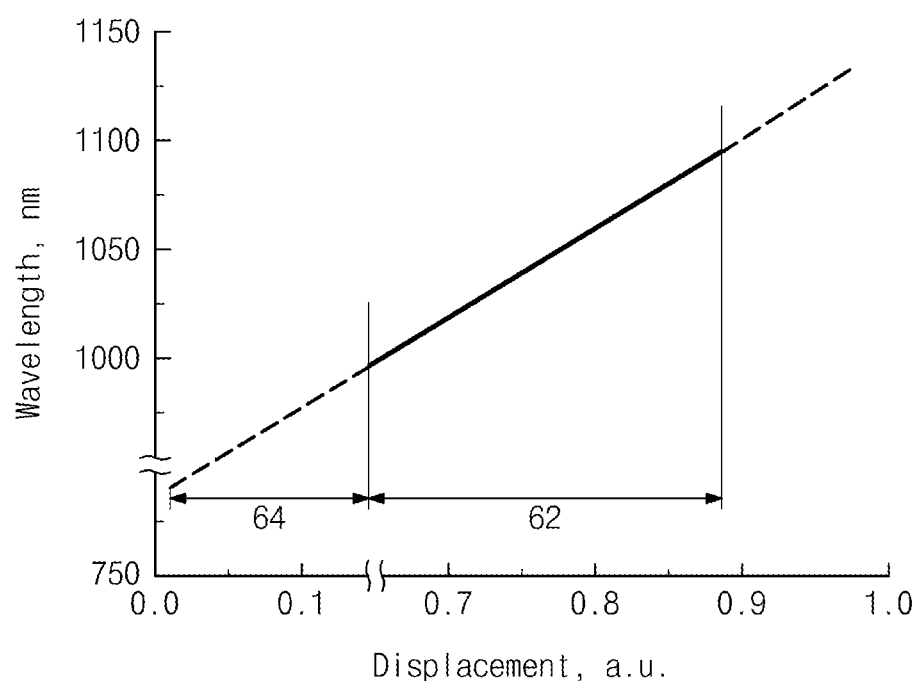
FIG. 4 is a graph showing a relationship between a displacement of a membrane of FIG. 1 and a wavelength of an emitted light.

FIG. 4 is a graph showing a relationship between a displacement of the membrane 76 of FIG. 1 and a wavelength of an emitted light.

Referring to FIGS. 1, 3, and 4, a wavelength of laser was proportional to a displacement of the membrane 76. Here, an abscissa axis of FIG. 4 represents a displacement of the membrane 76, which is given by a generalized value or by dividing a moving distance of the membrane 76 by a unit length. The membrane 76 may be configured in such a way that it moves within one third of a length of a movable region between the membrane 76 and the current spreading layer 40. An ordinate axis of FIG. 4 represents the wavelength of the laser.

The membrane 76 may induce optical resonance within a safe displacement region 62. An emitting wavelength of the laser may be within the high reflectivity spectrum range of the lower reflection layer 20.

The membrane 76 may be mechanically unstable within a pull-in region 64 and be stuck to the current spreading layer 40. For example, the two-thirds of the movable region of the membrane 76 may be the pull-in region 64 with mechanical instability. Due to the presence of the stopper 80, it is possible to prevent the membrane 76 from moving into the pull-in region 64. Further, the stopper 80 may prevent the membrane 76 from being stuck to the current spreading layer 40.

Accordingly, the surface-emitting laser can have a long lifetime and a high speed operation property.

The surface-emitting laser may be fabricated by a method described below.

FIGS. 5 through 13 are sectional views illustrating a method of fabricating a surface-emitting laser according to example embodiments of the inventive concept.

Figure 5:
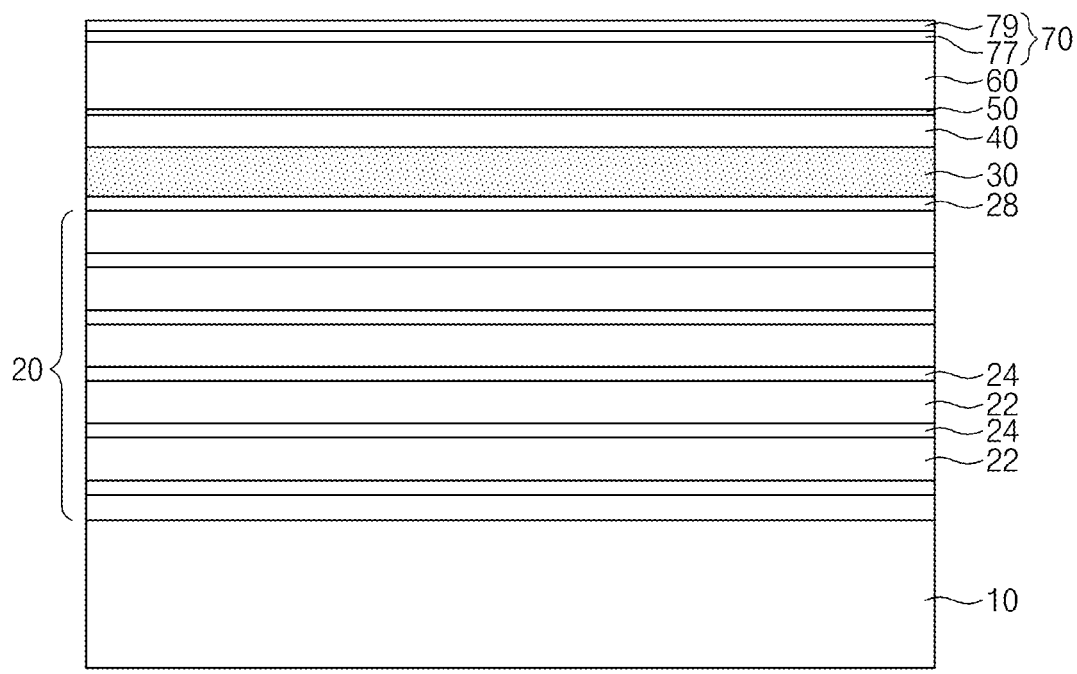
FIGS. 5 through 13 are cross-sectional views illustrating a method of fabricating a surface-emitting laser according to example embodiments of the inventive concept.

Referring to FIG. 5, the lower reflection layer 20, the current confining layer 28, the active layer 30, the current spreading layer 40, the ohmic contact layer 50, the sacrificial layer 60, and the upper reflection layer 70 may be formed on the substrate 10. The lower reflection layer 20, the active layer 30, the current spreading layer 40, the ohmic contact layer 50, the sacrificial layer 60, and the upper reflection layer 70 may be sequentially formed using a epitaxial growth technology. The epitaxial growth technology may include a metal organic chemical vapor deposition (MOCVD) or a molecular beam epitaxy process (MBE).

Figure 6:
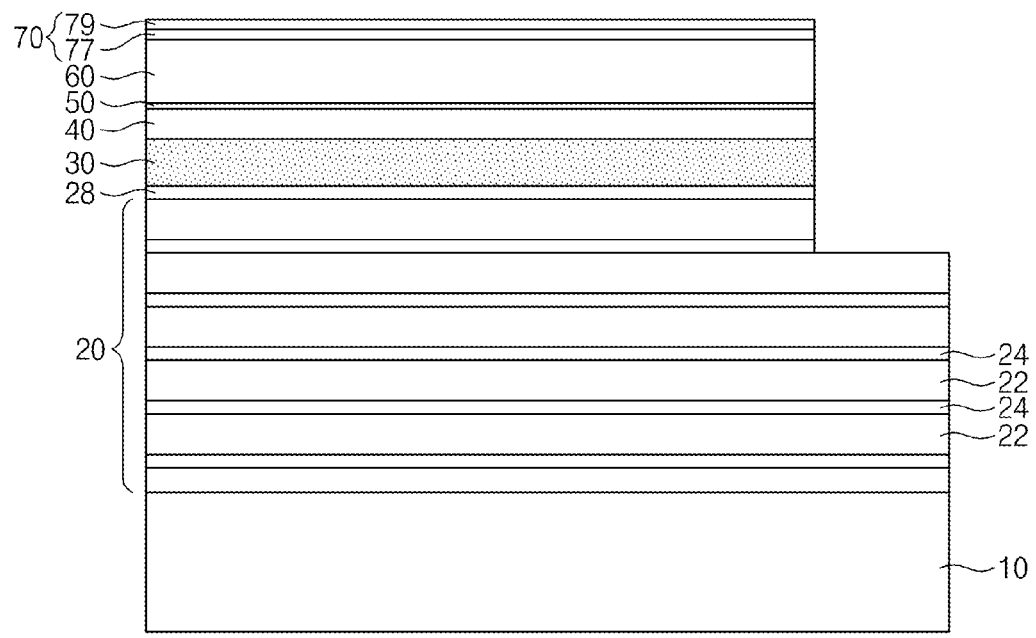

Referring to FIG. 6, the upper reflection layer 70, the sacrificial layer 60, the ohmic contact layer 50, the current spreading layer 40, and the lower reflection layer 20 may be partially removed to expose the outermost edge region of the lower reflection layer 20. The removal of the upper reflection layer 70, the sacrificial layer 60, the ohmic contact layer 50, the current spreading layer 40, and the lower reflection layer 20 may be performed using a photolithography process and an etching process.

Figure 7:
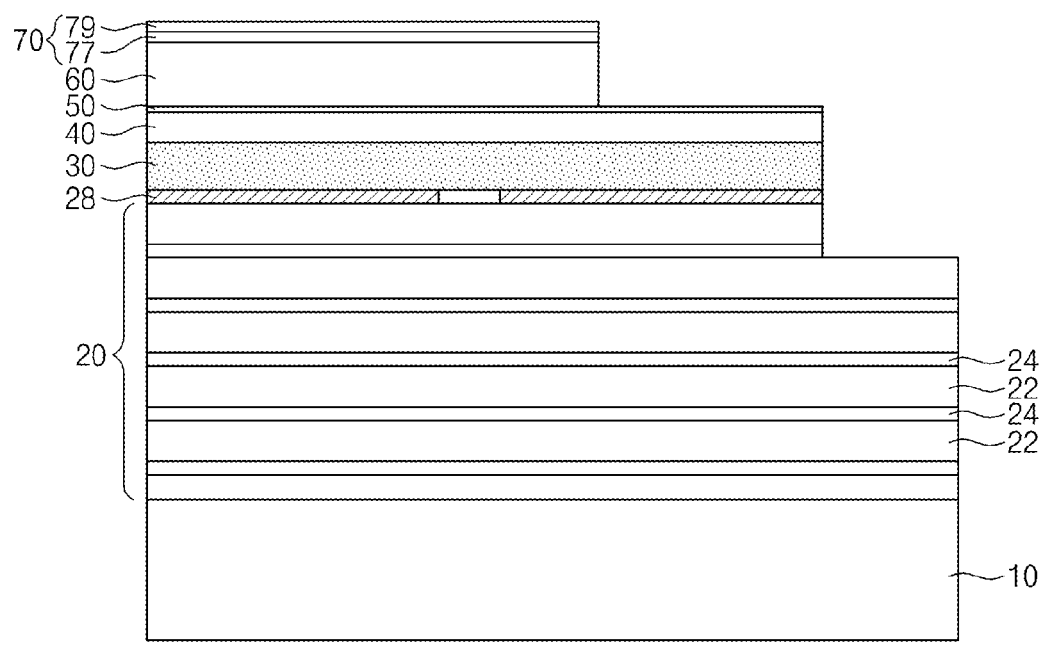

Referring to FIG. 7, the upper reflection layer 70 and the sacrificial layer 60 may be patterned. In example embodiments, the upper reflection layer 70 and the sacrificial layer 60 may be patterned using a photolithography process and an etching process. The patterning of the upper reflection layer 70 may include steps of patterning separately the fixation part 72, the spring 74, and the membrane 76. The ohmic contact layer 50 may be partially exposed as the result of the patterning of the upper reflection layer 70 and the sacrificial layer 60. Further, the current confining layer 28 may be formed by an oxidation process or a proton implantation process. In example embodiments, the current confining layer 28 may be formed of metal oxide.

Figure 8:
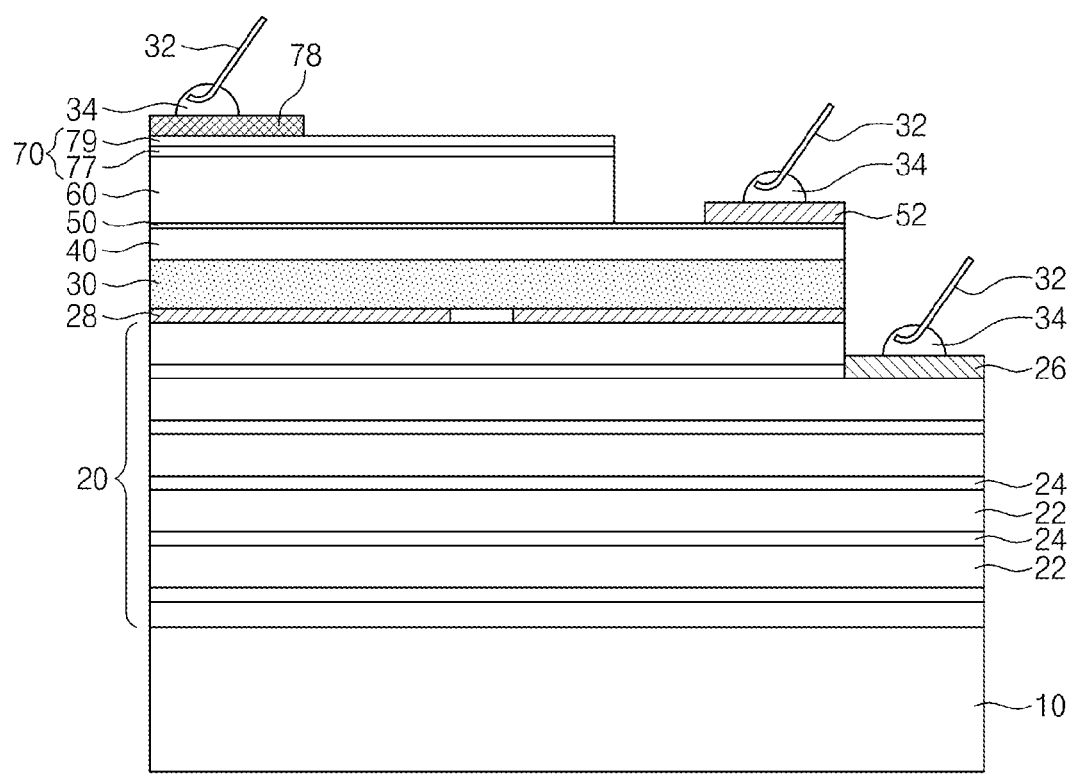

Referring to FIG. 8, the first electrode 26, the second electrode 52, and the third electrode 78 may be formed on the lower reflection layer 20, the ohmic contact layer 50, and the upper reflection layer 70, respectively. The first electrode 26, the second electrode 52 and the third electrode 78 may be formed using a photolithography process, a metal deposition process and a lift-off process. The metal deposition process may include a metal thermal evaporation process or a sputtering process. In addition, the solder ball 34 and the wire 32 may be formed on the first electrode 26, the second electrode 52, and the third electrode 78.

Figure 9:
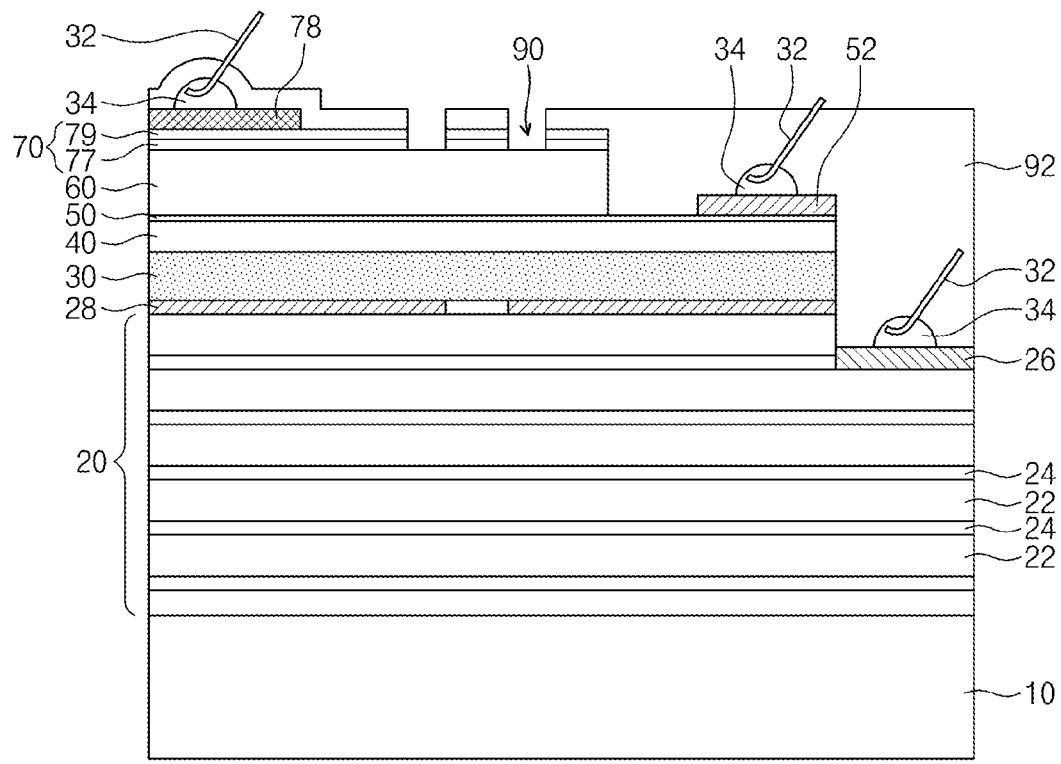

Referring to FIG. 9, the hole 90 may be formed through the upper reflection layer 70. The formation of the hole 90 may include a photolithography process and an etching process. For example, the photolithography process may include forming a photoresist pattern 92 on the upper reflection layer 70. The photoresist pattern 92 may serve as an etch mask in the etching process. The etching process may include a dry etching process or a wet etching process.

Figure 10:
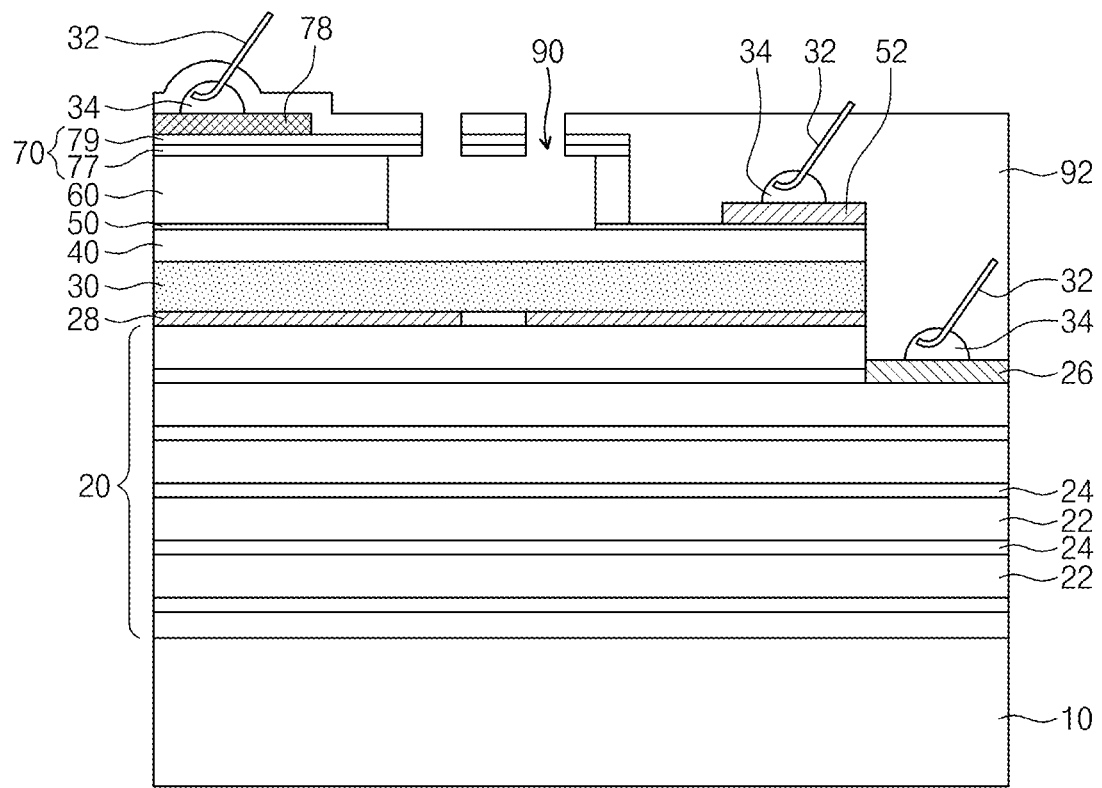

Referring to FIG. 10, the sacrificial layer 60 and the ohmic contact layer 50 exposed by the hole 90 may be removed. In example embodiments, a wet etching process may be used to remove the sacrificial layer 60. For example, during the wet etching process, the sacrificial layer 60 may be isotropically removed. The photoresist pattern 92 may be re-used as an etch mask in the wet etching process.

Figure 11:
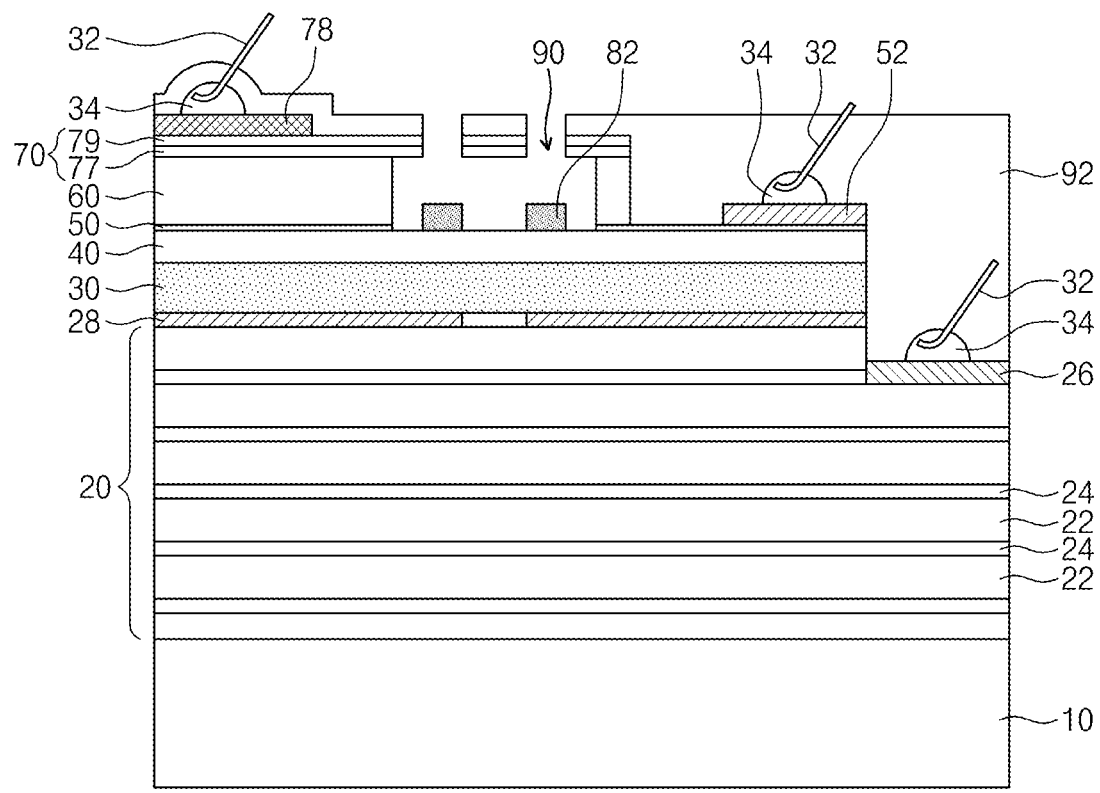

Referring to FIG. 11, the bottom block 82 may be formed on the current spreading layer 40. The bottom block 82 may be formed by a thermal evaporation process or an e-beam deposition process. In example embodiments, the bottom block 82 may be formed using a physical vapor deposition, such as a dielectric thermal evaporation and a sputtering process. Here, the bottom block 82 may have the same shape and diameter as those of the hole 90. Thereafter, the photoresist pattern 92 may be removed.

Figure 12:
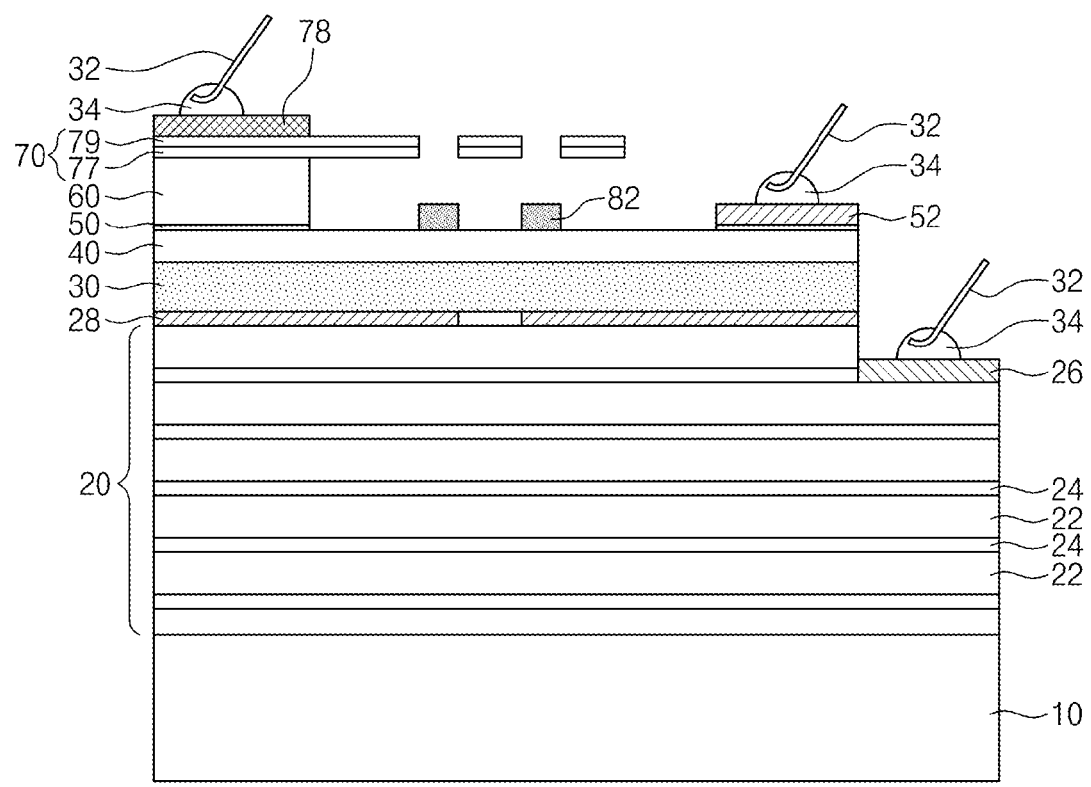

Referring to FIGS. 2 and 12, the sacrificial layer 60 below the spring 74 and the membrane 76 may be removed. The sacrificial layer 60 may be removed using a dry etching process or a wet etching process. The dry etching process may be performed using mixture of sulphur hexaflouride ($SF_6$) and silicon tetrachloride ($SiCl_4$) as a reaction gas. The wet etching process may be performed using mixture of ammonium hydroxide/hydrogen peroxide/deionized water as etching solution. The mixture solution may be prepared to have a mixture ratio of 150:1:1. The third electrode 78 may be used as an etch mask layer, when the sacrificial layer 60 is removed. Accordingly, the spring 74 and the membrane 76 of the upper reflection layer 70 may be floated or separated from the current spreading layer 40.

Figure 13:
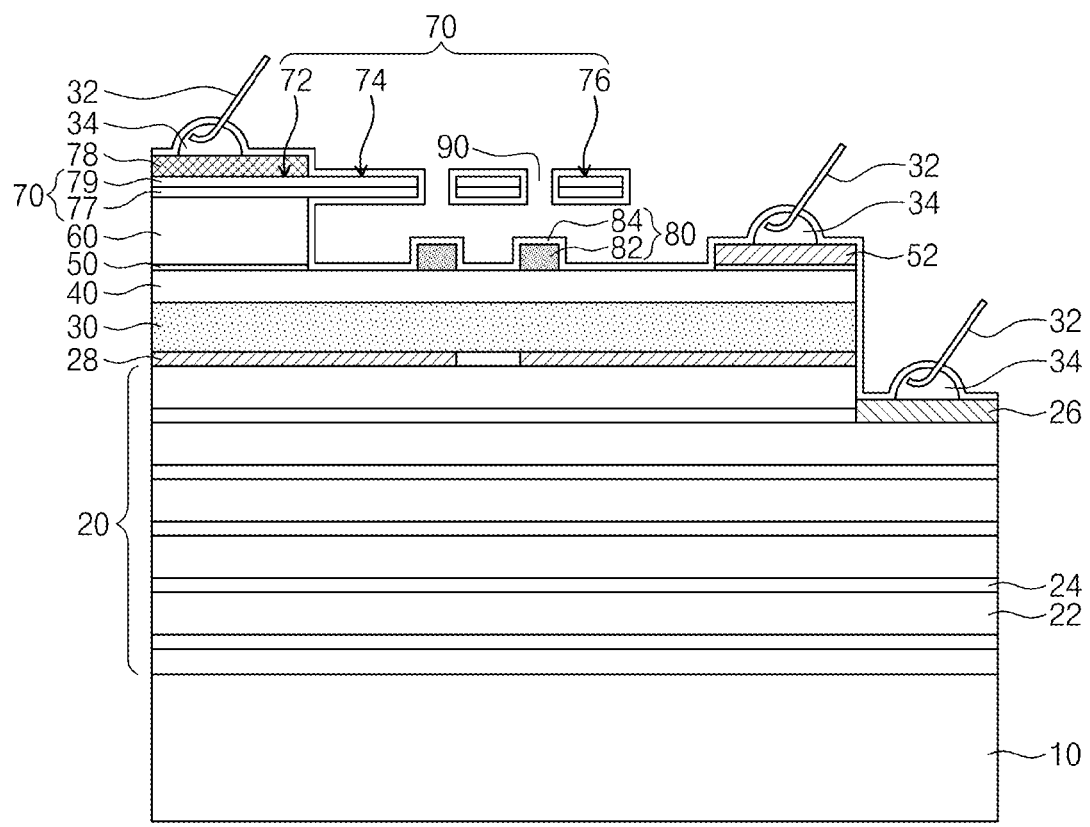

Referring to FIG. 13, the capping layer 84 may be formed on the substrate 10. The capping layer 84 may be formed using an atomic layer deposition or a chemical vapor deposition. The capping layer 84 may be formed to cover the bottom block 82 and the current spreading layer 40. The bottom block 82 and the capping layer 84 may constitute the stopper 80. The stopper 80 may have a diameter greater than that of the hole 90.

Further, the hole 90 may have a reduced size, due to the presence of the capping layer 84. Accordingly, a vertical movement of the membrane 76 may be limited by the stopper 80. The capping layer 84 may serve as a protection layer for the current spreading layer 40. Accordingly, the use of the method makes it possible to form the stopper 80, whose diameter is greater than that of the hole 90.

According to example embodiments of the inventive concept, a vertical-cavity surface-emitting laser may include a substrate, a lower reflection layer, an active layer, a current spreading layer, a sacrificial layer, an upper reflection layer, and a stopper. The sacrificial layer may be locally provided on the current spreading layer. The stopper may also be locally provided on the current spreading layer. In other words, the stopper may be provided spaced apart from the sacrificial layer. The sacrificial layer may have a top surface higher than that of the stopper. The upper reflection layer may include a fixation part, a spring, and a membrane. The spring may connect the fixation part to the membrane. The fixation part may be supported by the sacrificial layer. The membrane may be vertically separated from the stopper and the current spreading layer. Due to the presence of the stopper, it is possible to prevent the membrane from being stuck to the current spreading layer. This makes it possible to improve stability in mechanical operation of the device, and to increase an operation speed of the device.

Accordingly, the surface-emitting laser according to example embodiments of the inventive concept can have a long lifetime and a high speed operation property.

While example embodiments of the inventive concepts have been particularly shown and described, it will be understood by one of ordinary skill in the art that variations in form and detail may be made therein without departing from the spirit and scope of the attached claims.

What is claimed is:

1. A wavelength swept vertical-cavity surface-emitting laser, comprising:
   a substrate;
   a lower reflection layer on the substrate;
   an active layer on the lower reflection layer;
   a sacrificial layer disposed on a first side of the active layer;
   a stopper disposed on a second side of the active layer that is spaced apart from the sacrificial layer; and
   an upper reflection layer fixed on the sacrificial layer, the upper reflection layer extending over the stopper and the active layer, the upper reflection layer including:
     a fixation part on the sacrificial layer;
     a spring connected to the fixation part, the spring extending from the first side to the second side; and
     a membrane connected to the spring and separated from the stopper on the active layer;
   wherein the stopper defines a minimum separation distance between the upper reflection layer and the active layer and is positioned to prevent a portion of the membrane from moving into a pull-in region of the laser.

2. The laser of claim 1, wherein the spring further comprises at least one of a metal layer or a metal oxide layer.

3. The laser of claim 1, wherein the membrane is provided to have a hole exposing the stopper.

4. The laser of claim 3, wherein the stopper has a diameter greater than that of the hole.

5. The laser of claim 4, wherein the stopper comprises:
   a bottom block provided below the hole; and
   a capping layer covering the bottom block and active layer.

6. The laser of claim 5, wherein the bottom block has substantially the same shape as that of the hole.

7. The laser of claim 5, wherein the bottom block comprises a silicon oxide layer or a silicon nitride layer.

8. The laser of claim 5, wherein the capping layer comprises a metal oxide layer.

9. The laser of claim 5, further comprising a current spreading layer on the active layer, the current spreading layer disposed below the bottom block and the sacrificial layer.

10. The laser of claim 9, further comprising:
    a first electrode disposed on an edge of the lower reflection layer or substrate;
    a second electrode disposed on an edge of the current spreading layer; and
    a third electrode disposed on the fixation part of the upper reflection layer.

11. The laser of claim 10, wherein the capping layer is provided to cover the first electrode, the second electrode, and the third electrode.

12. The laser of claim 11, further comprising an ohmic contact layer between the second electrode and the current spreading layer.

13. The laser of claim 1, further comprising a current confining layer between the lower reflection layer and the active layer.

14. The laser of claim 1, wherein a top surface of the sacrificial layer is higher than that of the stopper.

15. A method of fabricating a wavelength swept vertical-cavity surface-emitting laser, comprising:
    stacking a lower reflection layer, an active layer, a current spreading layer, a sacrificial layer, and an upper reflection layer on a substrate;
    removing edge portions of the upper reflection layer, the sacrificial layer, the current spreading layer, and the active layer to expose a portion of the lower reflection layer;
    patterning the upper reflection layer to form a fixation part, a spring, and a membrane;
    removing an edge portion of the sacrificial layer to expose a portion of the current spreading layer;
    forming a first electrode, a second electrode, and a third electrode on the lower reflection layer or the substrate, the current spreading layer, and the fixation part, respectively;
    forming a hole through the membrane;
    removing a portion of the sacrificial layer located below the hole;
    forming a bottom block on the current spreading layer exposed by the hole;
    removing other portions of the sacrificial layer located between the spring and the current spreading layer and between the membrane and the current spreading layer; and
    forming a capping layer on the bottom block.

16. The method of claim 15, wherein the bottom block is formed by a thermal evaporation process or an e-beam deposition process.

17. The method of claim 15, wherein the removing of the sacrificial layer is performed using a dry etching process, in which mixture gas of sulphur hexaflouride and silicon tetrachloride is used as a reaction gas.

18. The method of claim 16, wherein the removing of the sacrificial layer is performed using a wet etching process, in which mixture of ammonium hydroxide, hydrogen peroxide, and deionized water is used as etching solution.

19. The method of claim 15, wherein the capping layer is formed by a chemical vapor deposition or an atomic layer deposition.

20. The laser of claim 1, wherein the pull-in region of the laser is from about 0 to about 0.3 of a generalized value between the active layer and the upper reflection layer on the sacrificial layer.

* * * * *